United States Patent [19]
Karlsson et al.

[11] Patent Number: 4,800,693
[45] Date of Patent: Jan. 31, 1989

[54] HEAT INSULATING WINDOW UNIT AND INSULATING BLOCKING COMPONENT THEREFOR

[75] Inventors: Jan Karlsson, Gothenburg; Ingemar Fasth, Hisings Backa, both of Sweden

[73] Assignee: Barrier HB, Sweden

[21] Appl. No.: 180,678

[22] Filed: Apr. 8, 1988

Related U.S. Application Data

[63] Continuation of Ser. No. 919,050, Oct. 15, 1986, abandoned, which is a continuation-in-part of Ser. No. 648,152, Sep. 4, 1984, abandoned.

[30] Foreign Application Priority Data

Jan. 4, 1983 [SE] Sweden ................................ 8300025

[51] Int. Cl.$^4$ ................................................. E06B 5/20
[52] U.S. Cl. ........................................ 52/171; 52/788; 428/34
[58] Field of Search ............. 52/173 R, 171, 788–791, 52/304, 398–400, 172; 428/34, 38

[56] References Cited

U.S. PATENT DOCUMENTS 4,019,295 4/1977 Derner et al. ......................... 52/171

FOREIGN PATENT DOCUMENTS 31 12/1978 European Pat. Off. .............. 52/788
1082386 5/1960 Fed. Rep. of Germany .
2461532 7/1976 Fed. Rep. of Germany ........ 52/788
2442948 8/1980 France ................................. 52/788

Primary Examiner—David A. Scherbel
Assistant Examiner—Richard E. Chilcot, Jr.

[57] ABSTRACT

A method is described for manufacturing a heat insulating window glass units which comprise two or more glass panes and at least one spacer frame element sized to follow the border of the panes with the frame element placed between each pair of inner surfaces of the panes facing each other to form inner spaces between the surfaces. The method includes providing a gas mixture by chosing, among gases having a high absorption of electromagnetic radiation in the wave-length field of 2–25 μm, and having a transparency without noticeable negative influence on visible light, a first gas having one or more absorption bands for infra-red radiation and chosing a second gas having one or more absorption bands for infra-red radiation with the bands being positioned in said region at other positions than the bands of the first gas, and chosing a third gas having one or more absorption for infra-red radiation the bands being positioned in said field in other positions than the absorption bands of the first and second gases and so on until a substantial part of the infra-red region in said wave length region is covered by said absorption bands of the gases chosen; mixing the gases chosen. The gases chosen are mixed and the mixture is inserted into said spaces whereupon the spaces are sealed.

7 Claims, 3 Drawing Sheets

GASCOMBINATION II:
$SF_6$, F12, F13, F22

GAS COMBINATION II:
SF6, F12, F13, F22

HEAT INSULATING WINDOW UNIT AND INSULATING BLOCKING COMPONENT THEREFOR

This application is a continuation of application Ser. No. 919,050 filed 10/15/86 now abandoned which is a continuation-in-part application of U.S. Ser. 648,152 filed Sept. 4, 1984 abandoned.

BACKGROUND OF THE INVENTON

The present invention relates to a window glass unit comprising a number of glass panes, preferably two or three held in spaced relation by a frame spacer elements and sealed to define at least one interpane space. The space or spaces contain a gas mixture with a high thermal insulating property.

Such window units are previously know for example from U.S. Pat. No. 4,019,295, Derner et al. In most such units manufactured the gas contained in the space or spaces is air. It has however been disclosed that other gases, inert gases and for example sulphur hexafluorid will give better insulating properties than air with respect to tranfer of heat and sound.

The gas mixtures previously proposed in this context seem to have been a result of experimental work. The gas mixture is composed of such gases which are known as having good insulating properties against transfer of sound or heat and they are mixed together to find a suitable compromise between a good sound and heat insulation. A way to find theoretical means to compose an optimal gas mixture for a certain application and certain desired insulating properties has not been presented in the literature.

SUMMARY OF THE INVENTION

The invention is based on the knowledge that for an insulating window-glass unit with gas-filled spaces and heat transfer by means of radiation is very important compared to heat transfer by means of conductivity and convection. In order to obtain good insultating properties it is consequently necessary to primarily limit the radiation. It has thereby been proposed to provide the glass surfaces with a transparent metal coating but this method will restrict the transparency.

To restrict the heat transfer by means of radiation without restricting the transfer of visible light only the radiation in the infra-red field has to be influenced. On the other hand, to reach an optimal insulating effect, as much as possible of the transfer through the window unit within the infra-red region has to be restricted. It has thereby been shown in connection with the invention that it is more effective to have good absorption of the radiation within as large a part as possible of the infra-red region than to have a very high absorption in smaller parts of the infra-red region.

It is not possible to have a broad absorption field by using a very restricted number of gases as each gas usable in this connection has one or a small number of absorption bands, which are very narrow and cover only a very small part of the infra-red spectrum.

In accordance with the invention it is therefore proposed to compose a gas mixture by chosing a first gas with one more strong absorption bands in the infra-red region, to chose another gas with one or more strong absorption bands in the infra-red region, such bands being placed at other wave bands in the infra-red spectrum than by the first gas and to chose a third gas with strong absorption wave bands, which are placed on still other wave bands than the absorption bands of the first and second gases and so on until the major part of the infra-red spectrum is covered.

DETAILED DESCRIPTION OF PREFERRED EMBODIMENTS

Figure 1:
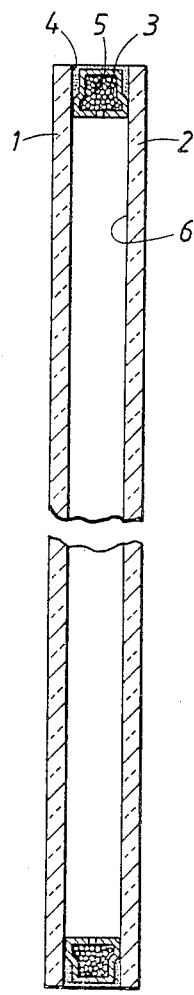
FIG. 1 shows a cross section of a window glass unit.

In FIG. 1 a cross section of a window glass unit of the kind to which the invention relates is shown. The same consists of two glass panes 1 and 2 connected by means of a spacer element in the form of a frame 3. The frame 3 is sealed and directed towards the inner surfaces of the panes 1, 2 opposite to each other by means of a sealing substance 4 such as synthetic rubber. The frame 3 is made with a hollow profile which is filled with a moisture-absorbing substance 5 such as silaca gel.

The frame 3 follows all the borders of the glass panes 1, 2, which in most cases are rectangular, hermetically enclosing a space 6 between the panes. In the space 6 is contained a gas mixture according to the invention. The sealing substance 4 forms a tight seal tight against the gas and the same will be kept in the space 6. The sealing substance also prevents moisture and air from being let into the space.

The window glass unit is, after assembly the same containing air in the space 6. This air is let out through a first hole in the frame 3 when the gas mixture is filled through a second hole in the frame, preferably opposite the outlet hole. By this arrangement the air in the space can be replaced by the gas mixture. After introducing the gas mixture said holes are sealed, preferably with the same sealing substance 4 as used in the frame joint.

The window shown in the cross section of FIG. 1 has only two panes and one gas-filled space. It is, however, also common to have two or more spaces. The number of spaces depends on the heat-insulating effect which is desired and which cost is acceptable. A window unit with three or four panes is of course more expensive than one with only two panes.

The window unit will be installed as an element of a building, for example, a wall, a roof or even a door. In such case it is mounted in a frame of wood or metal.

By composing the gas mixture, the choice is restricted to a limited number of gases fulfilling the following demands:

Boiling point not exceeding the lowest temperature occuring during the intended use of the window unit, preferably not exceeding $-20°$ C.

High absorption of electromagnetic radiation in the wave-length region of 2–25 $\mu$m, especially in the region 5–15 $\mu$m. The thickness of the gas layer in the space is supposed to be about 12 mm, the gas being at atmospheric pressure and mixed with other gases and having, limited partial pressure.

The gas should be mixable with other gases intended to be contained in the mixture without a negative influence on the properties of the other gases.

Transparency without registerable negative influence on visible light.

Low conductivity.

High thermal value (capacity to store heat).

High viscosity for limiting convection.

Inexplosive in the compositions which can be used for the present purpose.

Non-toxic in the concentration used.

Not emitting a radioactive radiation at a non-acceptable level.

Available for industrial use in sufficient quantities.

There will be a great number of gases which will fulfill these demands, however, to greater or lesses extent with respect to the absorption capacity for electromagnetic radiation. Of these usable gases a first gas has to be chosen, preferably a gas with high absorption in, as broad wave bands as possible, in the infra-red region. Sulfur hexafluorid is such a gas but in spite of the fact that this gas shows several strong absorption wave bands in the interesting region it only covers a very little part of the infra-red region. The next step will therefore be to find another gas among the usable ones, which has strong absorption fields in wave bands in other positions than the absorption wave bands of the first gas. By mixing the two gases a greater part of the infra-red field can be covered and the absorption increased. By introducing a third gas in the mixture which is chosen according to the same principle, that its absorption wave bands are positioned in other positions than in the gases chosen earlier, it will be possible to increase the absorption still more.

Figure 3:
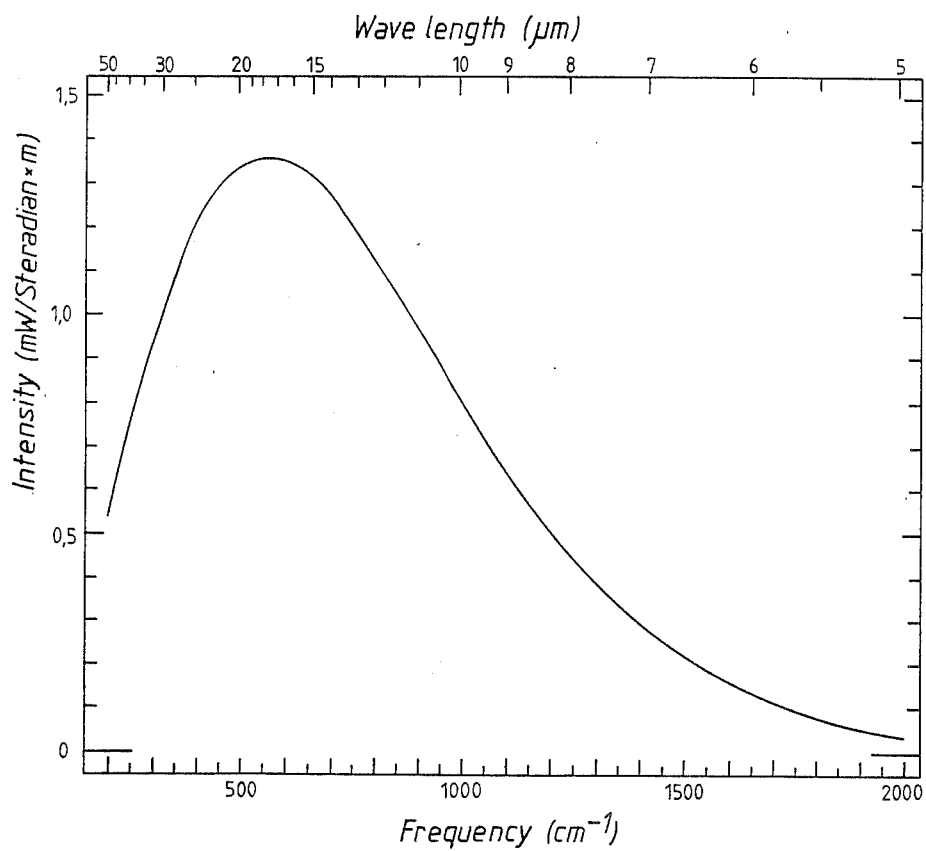
FIG. 3 is a diagram showing the intensity of the heat transfer related to the frequency of the radiation.

Of course, the best heat insulating effect will be reached if the absorption in the gas is highest where the intensity of the heat transfer is highest. In FIG. 3 is shown a curve for the intensity in mW/Steradian×m between the wave lengths 5–50 $\mu$m. From this curve it is evident that the intensity is the highest, that is, the radiation has its highest energy transferring capacity, at a wave length of 15–20 $\mu$m and a considerable intensity in the wave band 10–30 $\mu$m. Consequently, within these fields the absorption of the gases is most important and absorption is also important in the region nearer the shorter wave length down to 5–6 $\mu$m as will be evident from the curve in FIG. 3. The effect by means of the absorption in the form of decreasing of the energy flow by means of said radiation will be higher the higher the radiation intensity is within the wave length bands where the gas has its absorption bands.

Figure 2:
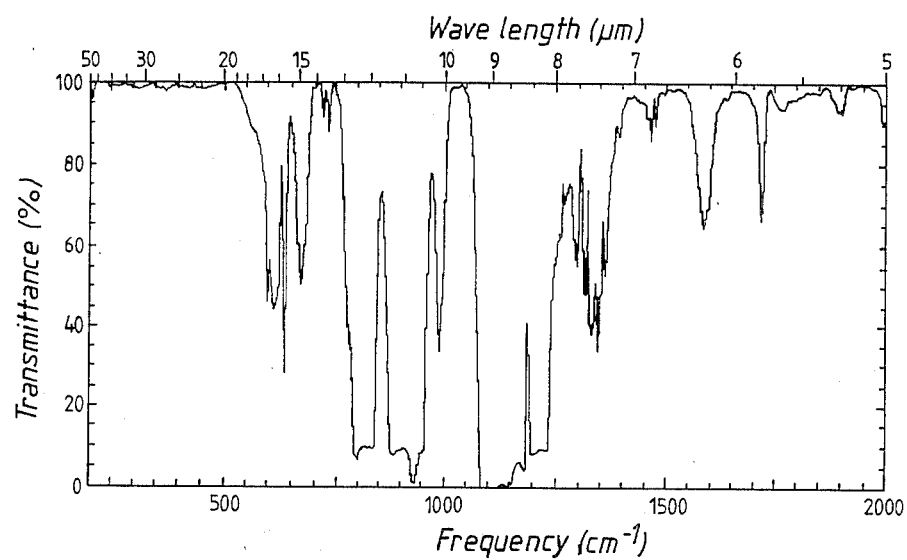
FIG. 2 is a diagram showing transmittance for a certain gas mixture in a certain wave field.

How this intensity top is covered by means of a gas combination of sulphur hexafluorid, Freon 12, Freon 13 and Freon 22 ($SF_6$, F12, F13, F22) is shown in FIG. 2. By means of this mixture a considerable part of the most intense radiation is absorbed (the lower parts of the curve in FIG. 2 as the curve is showing transmittance).

By a combination of the gases to be used for the mixture it is necessary to consider not only the basic demands and the strength and positions of the absorption fields but also the said factors as vicosity, heat conductivity and thermal value. As the heat energy not only is transferred by means of radiation a gas mixture with lower absorption can be more advantageous than one with higher absorption but also higher transfer by convection and/or conduction. One also has to take into consideration factors of comfort; it is possible to obtain a temperature compensation between day and night by utilizing certain gases with a high heat storing capacity and good heat inertia. A gas mixture which is optimal for all possible circumstances is not possible to compose as the demands may vary. In warmer climates a higher boiling point can be accepted if it is possible to attain better properties with respect to other demands by chosing to introduce gases with a higher boiling point.

The choice of gases and their relative pro-portions for the gas mixture in the space in the window glass unit will consequently be made according to the following parameters:

I.

Establishing the factors relating to the use of the window such as demands with respect to use at a certain, lowest temperature and the priority of the best possible insulating effect or some comfort factors.

II.

Analysis of the influence on the heat transfer of available and usable gases with respect to the strength of the absorption bands in the gases as well as the position of the bands within the wavelength region of interest.

III.

Combination of the gases so that they will complement each other so that their absorption bands are distributed over the interesting wave length region.

IV.

Corrections according to specific demands in the choice of gases or in the volume proportion in between them or complementing with gases having specific properties, for example, to increase the viscosity.

According to the decision relating to the volume proportions between the gases, their volumes in relation to each other are determined the partial pressure of the gases. A higher partial pressure will give a greater influence on the energy flow and will bring out other physical properties. The absorption is however not linear in its relation to the partial pressure, but the influence on the absorption of the respective gases within their wave length bands by lowering the partial pressure by mixing with other gases is relatively low.

For use in connection with the invention with respect to the characteristics mentioned before the following gases are of interest:

Primary group:

| | |
|---|---|
| Freon 12, $Cl_2CF_2$ | propylene, $CH_3CH:CH_2$ |
| Freon 13, $ClCF_3$ | propyne, $CH_3C:CH$ |
| Freon 13Bl, $BrCF_3$ | nitrous oxide, $N_2O$ |
| Freon 14, $CF_4$ | sulphur hexafluoride, $SF_6$ |
| Freon 22, $ClCHF_2$ | ammonia, $NH_3$ |
| carbon dioxide, $CH_2$ | |

Secondary group:

| | |
|---|---|
| methane, $CH_4$ | ethylene fluoride, $CH_2:CHF$ |
| ethylene, $CH_2:CH_2$ | propadine, $CH_2:C:CH_2$ |
| ethane, $CH_3CH_3$ | cyclopropane, $C_3H_6$ |
| acetylene, HC:HC | methyl oxide, $CH_3OCH_3$ |

A choice among these gases resulted in the following combinations of gases in mixtures being advantageous for the present use:

| Gases | Volume relations |
|---|---|
| I: $SF_6$, F13, F22 | 0,4 to 0,2 to 0,4 |
| II: $SF_6$, F12, F13, F22 | 0,2 to 0,3 to 0,2 to 0,3 |
| III: $CH_3:CH$, F12, | 0,5 to 0,2 to 0,1 to 0,2 |

| Gases | Volume relations |
|---|---|
| F13, F22 | |
| IV: SF$_6$, CH$_3$C:CH, F13, F22 | 0,2 to 0,5 to 0,1 to 0,2 |

The examples above represent advantageous embodiments of the invention when these gas mixtures are used for insulating window glass units. The effect on the heat transfer due to radiation has been measured and is represented in the following as percent of the maximum radiation transmission, taken from 100, which will give an expression for the lowering of the radiation transmission expressed in percent. Furthermore, a value (k-value) is indicated representing the entire heat transfer from side to side of the window glass unit measured in W/m$^2$ and °C. difference. These values, indicated with (A) are valid for a window glass unit with two panes and one space with a width of 12 mm and with (B) for three panes and two spaces each one with a width of 12 mm.

I: Reduction in radiation:

| 26,5% | k-value | (A) = 1,93 | (B) = 1,38 |
|---|---|---|---|

II: Reduction in radiation:

| 30,2% | k-value | (A) = 1,9 | (B) = 1,35 |
|---|---|---|---|

III: Reduction in radiation:

| 30,1% | k-value | (A) = 1,9 | (B) = 1,35 |
|---|---|---|---|

IV: Reduction in radiation:

| 29,8% | k-value | (A) = 1,92 | (B) = 1,36 |
|---|---|---|---|

Usual window glass unit filled with air
Reduction in radiation:

| ca. 0% | k-value | (A) 3 | (B) 2 |
|---|---|---|---|

The transparency for visible light was for all compositions very good, at least as good as for corresponding air-filled window units and no colouring of the light was observable. The conductivity of all the gas mixtures was low, about half the conductivity of air and also considerably lower than for argon. The mixtures also have low convection as a result of a low mobility of the molecules, resulting in a high viscosity. Also, the heat storing capacity and inertia with respect to transfer of heat was considerably higher than for window units filled with air or inert gas. For example, for a window unit filled with air, a change in temperature on the one side will be noticeable after a couple of minutes on the other side, but for the window filled with gas according to the invention a noticeble change in temperature occurs only after some hours. However, presently no measuring methods exists for these properties and they cannot be expressed in mathematic values. A higher heat storing capacity and inertia however means greater comfort, especially when external cicumstances change with respect to temperature and sun radiation.

We claim:

1. A method of manufacturing heat insulating window glass units, such method including the following steps:
   providing at least two glass panes of substantially the same size and at least one spacer frame element sized to follow the border of the panes:
   assembling the panes and the frame element or elements by means of a sealing substance with one frame element placed between each pair of inner surfaces of the panes facing each other to form one or more respective innerspaces between said surfaces, the sealing substance being provided to hermetically close said spaces together with said frame element;
   providing at least two openings in the respective frame elements into each space;
   providing a gas mixture of at least two gases, each selected from the group consisting of gases having a boiling point not exceeding the lowest estimated temperature of the window glass unit in use, having a high absorption of electromagnetic radiation in the wave-length region of 2–25 $\mu$m, having a transparency without noticeable negative influence on visible light, beaing non-explosive, non-toxic and non-radioactive in the concentration used in the mixture, including a first gas having one or more absorption bands for infrared radiation in said wave-length region; and selecting a second gas having one or more absorption bands for infra-red radiation in said wave-length region, the bands being substantially positioned in said region in other positions than the bands of the first gas, and selecting a third gas and further gases, each having one or more absorption bands for infra-red radiation in said wave-length field the bands being substantially positioned in said field in other positions than the absorption bands of the first and second gases and further gases so that a substantial part of the infra-red transmission in said wave-length region is blocked by said absorption bands of the selected gases thus absorbing a substantial portion of the infrared radiation impinging upon said glass planes and thus, reducing the transmission of heat through said windows;
   inserting said gas mixture into said spaces through one of said openings while exhausting the spaces through the other opening of any gas or air enclosed in the spaces while assembling the window glass unit; and
   sealing said inserting and exhausting openings after filling the spaces with said gas mixture.

2. The method according to claim 1 in which the choice of gases for the mixture are selected from the group consisting of: Freon 12, Freon 13, Freon 13B, Freon 14, Freon 22, carbon dioxide, methane, ethylene, ethane, propylene, propyne, nitrous oxide, ammonia, sulfur hexafluoride, ethylene fluoride, propadine, cycopropene, acetylene and methyl oxide.

3. The method according to claim 2 in which said gases are SF$_6$, F12, F13 F22 in substantially equal amounts.

4. An insulating gas mixture for heat insulating windows comprising multiple glass panes juxtaposed in sealed spaced relationship, said sealed spaces containing said gas mixture, said gas mixture comprising at least two gases each having a boiling point not exceeding the lowest estimated temperature of the window glass unit in use, and selected for having a combined high absorption of electromagnetic radiation in the wave-length region of 2–25 μm, having a transparency without noticable negative influence on visible light, being non-explosive, non-toxic and non-radioactive in the concentration used in the mixture; including a first gas selected for having one or more absorption bands for infrared radiation in said wave-length region; and selecting a second gas having one or more absorption bands for infra-red radiation in said wave length region, the bands being substantially positioned in said region in other positions than the bands of the first gas, and selecting a third gas and further gases each having one or more absorption bands for infra-red radiation in said wave-length region, the bands being substantially positioned in said region in other positions than the absorption bands of the first and second and further gases so that a substantial part of the infra-red transmission in said wave length region is blocked by said absorption bands of the selected gases, thus absorbing a substantial portion of the infrared radiation impinging upon said glass planes and thus reducing the transmission of heat through said windows.

5. The gas mixture according to claim 4 wherein said gas mixture is selected from component gases of the group consisting of gases preferably having low thermal conductivity, high thermal value and high viscosity from among said properties of the gases having said absorption bands in the stated infrared region.

6. The gas mixture according to claim 5 wherein said gas mixture is selected from infra-red absorbing component of the group consisting of

| | |
|---|---|
| Freon 12, $Cl_2CF_2$ | propylene, $CH_3CH:CH_2$ |
| Freon 13, $ClCF_3$ | propyne, $CH_3C:CH$ |
| Freon 13Bl, $BrCF_3$ | nitrous oxide, $N_2O$ |
| Freon 14, $CF_4$ | sulfur hexafluoride, $SF_6$ |
| Freon 22, $ClCHF_2$ | ammonia, $NH_3$ |
| carbon dioxide, $CO_2$ | |
| methane, $CH_4$ | ethylene fluoride, $CH_2:CHF$ |
| ethylene, $CH_2:CH_2$ | propadine, $CH_2:C:CH_2$ |
| ethane, $CH_3CH_3$ | cyclopropane, $C_3H_6$ |
| acetylene, $HC:HC$ | methyl oxide, $CH_3OCH_3$ |

7. The mixture according to claim 6 wherein the gases selected are $SF_6$, F12, F13, F22 in substantailly equal proportions.

* * * * *